United States Patent
Cohen et al.

(10) Patent No.: US 7,219,047 B2
(45) Date of Patent: May 15, 2007

(54) SIMULATION WITH CONVERGENCE-DETECTION SKIP-AHEAD

(75) Inventors: Alain Cohen, Washington, DC (US); Pradeep K. Singh, Arlington, VA (US); Arun Pasupathy, McLean, VA (US); Stefan Znam, Rockville, MD (US)

(73) Assignee: OPNET Technologies, Inc., Bethesda, MD (US)

( * ) Notice: Subject to any disclaimer, the term of this patent is extended or adjusted under 35 U.S.C. 154(b) by 778 days.

(21) Appl. No.: 10/112,179

(22) Filed: Mar. 28, 2002

(65) Prior Publication Data

US 2002/0143513 A1    Oct. 3, 2002

Related U.S. Application Data

(60) Provisional application No. 60/279,895, filed on Mar. 29, 2001, now abandoned.

(51) Int. Cl.
*G06F 17/50* (2006.01)
(52) U.S. Cl. .................. 703/17; 702/179; 702/181; 703/21
(58) Field of Classification Search ............. 703/14, 703/17, 19, 21; 370/338, 412, 389, 357; 709/226, 235
See application file for complete search history.

(56) References Cited

U.S. PATENT DOCUMENTS

| | | | | |
|---|---|---|---|---|
| 4,791,593 A | * | 12/1988 | Hennion | 703/14 |
| 4,985,860 A | * | 1/1991 | Vlach | 703/17 |
| 5,440,719 A | * | 8/1995 | Hanes et al. | 703/21 |
| 5,850,538 A | * | 12/1998 | Steinman | 703/21 |
| 6,031,987 A | * | 2/2000 | Damani et al. | 703/17 |
| 6,134,514 A | * | 10/2000 | Liu et al. | 703/17 |
| 6,278,963 B1 | * | 8/2001 | Cohen | 703/17 |
| 6,563,829 B1 | * | 5/2003 | Lyles et al. | 370/395.21 |
| 6,820,042 B1 | * | 11/2004 | Cohen et al. | 703/2 |

(Continued)

FOREIGN PATENT DOCUMENTS

EP         314370 A2  *  5/1989

(Continued)

OTHER PUBLICATIONS

Krzystof Pawlikowski□□Steady-State Simulation of Queueing Process:A survey of Problems and Solution□□ACM Computing Surveys, vol. 22, No. 2, Jun. 1990.*

(Continued)

*Primary Examiner*—Kamini Shah
*Assistant Examiner*—Cuong Van Luu
(74) *Attorney, Agent, or Firm*—Robert M. McDermott

(57) ABSTRACT

A sub-system is provided to a discrete event simulator (DES) to expedite simulation execution by first detecting a non-quiescent steady-state condition in the simulated system, and when the steady-state condition is detected, the simulator determines a state, and subsequently simulates the system at a skip-ahead time using this determined state, or a predicted state based on the determined state. Convergence analysis is used to determine whether the system is at, or approaching, a steady-state condition. This convergence skip-ahead process achieves faster analysis by avoiding the computation that would conventionally be required to simulate the system behavior during the time interval that is skipped.

37 Claims, 2 Drawing Sheets

U.S. PATENT DOCUMENTS

| | | | |
|---|---|---|---|
| 2001/0000813 A1* | 5/2001 | Ma et al. | 709/233 |
| 2002/0071393 A1* | 6/2002 | Musoll | 370/248 |
| 2002/0122410 A1* | 9/2002 | Kulikov et al. | 370/349 |
| 2002/0133325 A1* | 9/2002 | Hoare et al. | 703/17 |
| 2002/0147937 A1* | 10/2002 | Wolf | 714/4 |
| 2002/0163932 A1* | 11/2002 | Fischer et al. | 370/465 |
| 2002/0176431 A1* | 11/2002 | Golla et al. | 370/412 |
| 2004/0246897 A1* | 12/2004 | Ma et al. | 370/230 |
| 2005/0152319 A1* | 7/2005 | Kubler et al. | 370/338 |

FOREIGN PATENT DOCUMENTS

| | | | |
|---|---|---|---|
| EP | 595440 A2 * | 5/1994 | |

OTHER PUBLICATIONS

Jean-Marie Garcia et al☐☐Differential Traffic Modelling and Distributed Hybrid simulation☐☐Calculateurs paralleles, vol. 18—n Mar. 2001.*

John Schormans et al☐☐A Hybrid Technique for Accelerated Simulation of ATM Networks and Network Elements☐☐ACM Transactions on Modeling and Computer Simulation, vol. 11, No. 2, Apr. 2001, pp. 182-205.*

Co-pending U.S. Appl. No. 09/624,092, filed Jul. 24, 2000, Cohen et al.

* cited by examiner

SIMULATION WITH CONVERGENCE-DETECTION SKIP-AHEAD

This Application claims the benefit of Provisional Application 60/279,895, filed 29 Mar. 2001 now abandoned.

BACKGROUND OF THE INVENTION

1. Field of the Invention

This invention relates to the field of simulation, and in particular to the enhancement of a simulator's performance via convergence-detection.

2. Description of Related Art

Simulators are commonly used to determine and/or verify the expected operation of a system, often before the system is built. A description of the system is encoded as a simulation model, along with a description of example initial conditions and subsequent input stimuli that are to be applied to the system. The simulator initializes the model based on the given initial conditions, and then proceeds to apply the sequence of input stimuli to the model. As the initial conditions and subsequent stimuli are applied, the simulator determines the effects of these events on each component within the system, and allows the user to view these effects using, for example, graphic plots of output waveforms, histograms, state diagrams, and the like. By modeling the system and simulating its performance given sample input stimuli, the operation of the system can be determined or verified without having to actually build the system.

Another widespread use of simulators is to determine the effects that might result from proposed changes to a system. The virtual system environment provided by simulators is often necessary, invaluable, and widely used for developing and evaluating proposed additions to a system's architecture. OPNET Technologies, Inc. provides a suite of simulation products to describe a communications system using networking components, technologies, and protocols. Modeling and simulation also allow a user to determine, for example, the effects of potential component failures in the system, and to evaluate the improvements that a proposed fail-safe configuration may provide. Simulations are also considered essential as tools for validating proposals in system environments characterized by heterogeneity, and/or in large-scale topologies. Simulations also allow for a determination of the effects that proposed changes might have to alleviate bottlenecks and other system deficiencies. Such simulations and evaluations are often used to provide a cost versus benefits analysis for determining whether or not a proposed change to the system will provide sufficient benefit to justify the cost of the change. Other prospective applications include deployment of network devices, configuration of devices, test design of new protocols and so on.

In the circuit and system design field, simulators are used to verify the proper operation of an intended design, before the circuit or system is built. A schematic or net-list defines the interconnection of components forming the circuit or system. A user specifies a set of input stimuli, and the simulator propagates the effects of these stimuli through the components to produce a corresponding set of output events. Alternatively, the simulator may be configured to determine a set of input stimuli that achieves a particular goal, such as a set of input stimuli that facilitate an optimal detection of potential faults in the circuit or system.

Because a computer-based simulation of a modeled system or component may consume more, or less, time than the operation of an actual system or component, a virtual time-base is used within a simulator. That is, a user may specify that input events E1, E2, E3, etc. occur at times T1, T2, T3, etc., and the simulator may report output events corresponding to these input events occur at times T1+D1, T2+D2, T3+D3, etc., without regard to the real-time required by the simulator to determine and report the output events. Unless otherwise noted below, the times associated with simulated events correspond to the virtual time-base that is used by the simulator to model events and corresponding outputs, and the term "clock" refers to the timekeeping used to maintain this virtual time-base.

To optimize the performance of a conventional simulator, the simulator is structured to be event-driven. When a specified input event occurs, the components that are directly affected by this input event are reevaluated with this event as an input. If the output of a component changes in response to this reevaluation, the components that are directly affected by this changed output event are reevaluated. This reevaluation of components continues until no further changes occur, that is, until all of the effects of the input event occur, and the system reaches a quiescent state corresponding to this input event. When the system reaches a quiescent state, the simulator is configured to "advance its clock" to the next scheduled input event, because it is known that once the system reaches a quiescent state, it will stay in this quiescent state until something forces a change. In this manner, although an output may be continually produced corresponding to this quiescent period, the simulator is not actually consuming real-time or resources reevaluating the components during this period. Thus, the effective real-time required to perform the simulation is substantially reduced, compared to a simulator that is configured to reevaluate each component at each unit of time. Typically, performance improvements in the order of hundred-fold or thousand-fold can be achieved via an event-driven simulator with quiescent-state advancement of its clock.

Unfortunately, the performance improvements provided by a quiescent-state clock-advance can only be achieved for simulated systems that regularly achieve a quiescent-state. That is, for example, in a typical digital circuit design, the design is configured to achieve a quiescent-state prior to each clock transition, so that an unchanging logic value will be present at each clocked device's input, thereby assuring repeatable and reliable performance. In the simulation of such systems, when the effects of a clock transition are completed and the simulated system is in a quiescent state, the simulation time is advanced to the next clock transition. Many systems, however, rarely achieve a quiescent state. An analog audio system, for example, receives a continuously changing input signal, and produces a continuously changing output signal. Similarly, in a networking system, typically designed for continuous and/or bursty-traffic, the relationship between traffic dynamics and protocol interactions creates unpredictable fluctuations in the system behavior. While simulating these complex systems, the simulators may not reach a quiescent state and, thereby, may incur long run-times to predict the behavior of the actual systems being modeled.

BRIEF SUMMARY OF THE INVENTION

It is an object of this invention to improve the performance of a simulator by providing a skip-ahead process for non-quiescent states. It is a further object of this invention to provide a simulator that efficiently simulates non-quiescent systems by facilitating a skip-ahead process in the simulation of such a system.

These objects and others are achieved by a simulator and process that are configured to detect a steady-state condition in the simulation of a continuous system. The steady-state condition need not be a quiescent-state condition. When the steady-state condition is detected, the simulator skips-ahead to a next event, and uses the steady-state condition to determine or predict the state of the system at the time of the next event.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
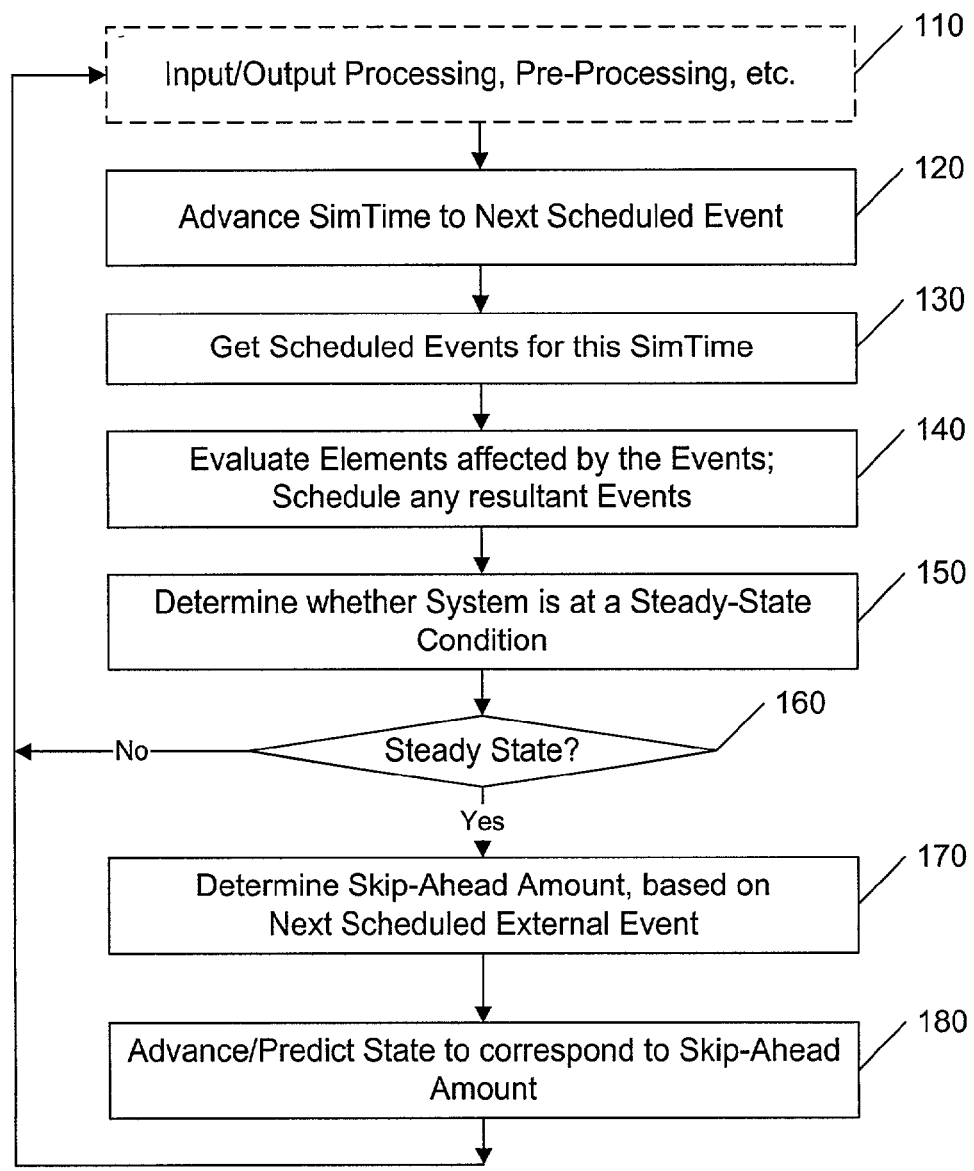
FIG. 1 illustrates an example flow diagram for a simulator in accordance with this invention.

The invention is presented herein using a network simulator as a paradigm application for this invention, although the principles presented herein will be recognized by one of ordinary skill in the art to be applicable to other simulator and similar processes. For ease of reference, the terms "clock-advance" and "skip-ahead" are used herein to distinguish between the above described advancement of the simulation time based on a quiescent-state of the system, and the below described advancement of the simulated state based on a steady-state analysis of the system. Also for ease of reference, the terms "quiescent-state" and "steady-state" are used herein to distinguish between quiescence, or lack of activity, and a predictable continuation of activity; that is, as will be evident from the remainder of this disclosure, the term "steady-state" is defined herein as a non-quiescent-state.

Copending U.S. patent application "MIXED MODE NETWORK SIMULATOR", Ser. No. 09/624,092, now U.S Pat. No. 6,820,042 filed 24 Jul. 2000 for Alain Cohen, George Cathey, and P J Malloy, teaches a simulator that is particularly well suited for the efficient simulation of complex networks, and is incorporated by reference herein. This copending application presents a mixed-mode simulator and method that combines the advantages of both analytical modeling and discrete-event simulation. Traffic on the network is modeled as a combination of background-traffic and explicit-traffic. The background-traffic is primarily processed in an analytical form, except in the "time-vicinity" of an explicit-event. Explicit-events are processed using discrete-event simulation, and the modeled effects are dependent upon the background-traffic. At each occasion that the background-traffic may affect the explicit-traffic, the background-traffic is particularized into events that are modeled at the lower detail level of the explicit-traffic. In this manner, the portions of the network that are unaffected by the explicit-traffic and that have no effect on the explicit-traffic are modeled and processed at an analytical level, consuming minimal processing time and memory resources, while the portion of the network affected by the explicit-traffic and the background-traffic that affects the explicit-traffic are processed at the lower level of detail.

The simulator of the copending application achieves the performance advantages of an event-driven simulation, and is able to achieve some performance advantages of a clock-advance process, even though the typical network that is simulated rarely enters a quiescent state. The performance improvement is achieved by only treating explicit-traffic as effect-generating events. Background-traffic is accounted for, but does not directly constitute events. After appropriate initialization, including the analytical processing of the background-traffic, the simulator advances its clock to the first explicit-traffic event. To determine the effects of this explicit traffic in the presence of the background-traffic, the simulator "looks-back" a certain time period, and generates "implicit-events" based on the parameters of the background traffic. For example, the background-traffic may specify an average packet transmission between nodes A and B every N seconds, with an average packet size of M bytes. When the simulator "looks back", an implicit event generator at node A generates M-byte sized packets every N seconds, addressed to node B. Parameters associated with the background-traffic can be used to introduce some variability to these transmissions. These implicit events are simulated at the same level as the explicit-traffic events.

Provided that the "look-back" period is sufficiently long, when the simulator reaches the time of the explicit-traffic event, the simulated system will be in a state that corresponds to a likely state of the system, based on background-traffic implicit events. That is, a particular network node will have received a number of implicitly generated packets, will have transmitted some of these generated packets to particular destinations, and will have some of the implicitly generated packets in its queue when the explicit-traffic arrives. Thereby, the state of the network node can be expected to represent a realistic condition when the explicit-traffic event arrives, and a realistic response to this explicit-traffic event can be provided.

When the effects of the explicit-event at a node are completed, the node is deemed to be in a quiescent state, relative to this explicit-event at the node, and the node is no longer simulated, even though the implicit-events would traditionally be treated as events in a conventional simulator, and the node would not be in a quiescent-state, per se. Upon achieving a quiescent-state, using this 'unconventional' definition of quiescence based only on the explicit-event, the simulator advances its clock to the next explicit-event, thereby saving simulation real-time and resources that would conventionally be consumed in the simulation of implicit events.

From the beginning of the look-back period until after the explicit-traffic event is processed, the simulator of the copending application performs as a conventional event-driven simulator. The invention of this disclosure addresses a technique for improving the speed of simulation of a conventional event-driven simulator, and is particularly well suited for accelerating the performance of the simulator of the copending application during this look-back period.

FIG. 1 illustrates an example flow diagram of a simulation process in accordance with this invention. At 110, a number of tasks are performed, independent of this invention, to preprocess and postprocess the information provided to or provided by the simulation process. For example, any requested displays of output waveforms will be updated with the latest simulation result, any changes to the stimuli that drives the simulation process will be processed and scheduled, and so on. Such tasks are common in conventional simulators, and known to one of ordinary skill in the art.

At 120, the simulation process commences by advancing the simulation time, SimTime, to the next scheduled event. It is in this step that conventional simulators achieve the aforementioned quiescent-state clock-advance advantages. In a conventional simulator, the scheduled events include both external events (the input stimuli or conditions that are applied to the simulated system over time), as well as internal events (the events that are produced by the components within the simulated system as the input stimuli is applied). In the simulator described in the aforementioned copending patent application, the internal events are not processed after the effects of the explicit-events are processed, and quiescence is defined relative to the explicit-events only. If the system is quiescent, there will be no remaining internal events in the schedule, or, in the example simulator of the copending patent application, no remaining internal events of interest. Thus, advancing the simulation time to the next scheduled event at 120 provides for the aforementioned quiescent-state clock-advance to the next external event. It also provides for interim quiescent-state clock-advance between internally generated events.

The scheduled events for this SimTime are determined, at 130, and applied to the corresponding elements in the simulated system, at 140. As noted above, only the elements that are potentially affected by a scheduled event are evaluated, thereby further improving the efficiency of the simulation process. The evaluation of the potentially affected elements may produce a change in the elements' states, which in turn produces one or more new events at future times. These new events, if any, are scheduled for subsequent processing by the simulator, when the simulation time, SimTime, advances to the scheduled time.

In accordance with this invention, at 150, the simulator determines whether the system is in a steady, albeit non-quiescent, state. Such a non-quiescent steady-state condition may be, for example, the production of a periodic signal from a component, the production of a continuous count by an incrementing device, the production of continuous traffic by a network node, the stabilization of queue lengths in a switching or processing node, and so on. In accordance with this invention, the term steady-state is used to define a state that is substantially void of transient, or unpredictable, behavior. Alternatively stated, a steady-state is a state from which a future state can be predicted. In the example of the detection of a periodic signal, such as an oscillation, the future state can be predicted based on the determined phase of the signal at a future time, absent an external event that may change its phase. In the example of a network node that is producing continuous traffic, the node can be predicted to produce this same continuous traffic at a future time, absent an external event that may change its traffic pattern. In the example of a queuing node, the average queue lengths (the number of items in the queue) and/or average queue times (the duration of time that an element remains in the queue) can be expected to remain stable, absent a change of flow to or from the node.

In a preferred embodiment, convergence-analysis is used to determine whether a system is in a steady-state condition, or approaching a steady-state condition. In the analysis of switching networks, for example, background traffic is commonly modeled as a stochastic process, and the nodes of the network are modeled as multiple-input, multiple-output queues. Convergence-analysis is used in this example to determine when and if the queues have achieved a steady-state condition. If the change of each queue length of a node is within a given limit, the node is deemed to have converged to a steady-state condition, even though the node is not, per se, quiescent. These and other techniques for determining a steady-state condition will be evident to one of ordinary skill in the art in view of this disclosure, and are discussed further below.

If, at 160, a steady-state condition is not detected, the simulator loops back to repeat the above described simulation process of blocks 110–160. If a steady-state condition is detected, the simulator of this invention determines an appropriate skip-ahead amount, based on the next scheduled external event, at 170. Depending upon the particular application, the simulator may be configured to skip-ahead all the way to the next scheduled external event, or it may be configured to skip-ahead to a particular period before the next scheduled external event, so as to appropriately condition the simulated system for the next scheduled external event. For example, in the oscillation example, the simulator is preferably configured to skip-ahead by a whole number of periods of the oscillation. In this manner, the state of each element remains the same, and a phase-adjustment calculation need not be performed. In the example of the network node that is providing continuous traffic, the particular state of the nodes affected by this continuous traffic at the time that the steady-state condition is detected can be considered representative of any future time while the node remains in this steady-state condition. In such an example, the skip-ahead time can be arbitrarily set at some time equal to, or prior to, the next scheduled external event, and the state of the nodes can be assumed to be valid at this set time. In the example of a queuing node, the steady-state distribution of the queue lengths can be used to estimate the queue length at the time of the next external event.

At 180, the state of the system is advanced. In general, whatever information is required to place the system in the determined or predicted steady-state condition is carried forward by the determined skip-ahead amount. This information is dependent upon the particular simulation technology. In the case of a network node, this information may be the steady-state distribution of the various contained queue sizes. Because the state of a node is defined by its current queue parameters, the steady-state skip-ahead mechanism initializes the queue parameters to the determined steady-state queue parameters at the time of the next explicit event. Thereafter, the node is simulated with these assumed queue parameters at the time that the next explicit event arrives. In the example of a circuit simulator, the information required to advance or predict the state of the system at the determined skip-ahead time may be the voltage and current levels at a plurality of nodes, as well as any scheduled changes to these voltages and currents.

Upon advancing the steady-state by the skip-ahead amount, at 180, the simulator loops back to repeat the simulation process 110–180. Note that the simulation time SimTime is advanced to 120, and at this time, the system is simulated at under the determined or predicted steady-state condition.

Figure 2:
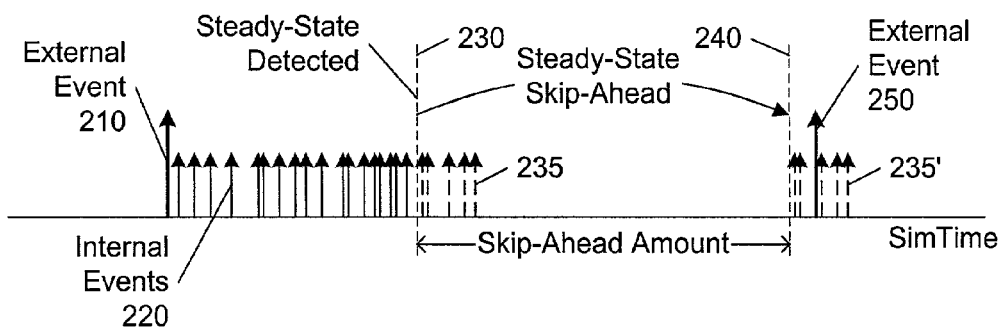
FIG. 2 illustrates an example timing diagram of a simulation in accordance with this invention.

FIG. 2 illustrates an example timing diagram of the skip-ahead process discussed above, in a general case. The external events 210 and internal events 220 are illustrated as occurring at particular times in the simulation time reference, SimTime. At some point in time 230, the simulator in accordance with this invention detects a steady-state condition, and prepares to advance the state by a skip-ahead amount. As noted above, the skip-ahead amount may be related to the periodicity of the steady-state phenomenon, or it may be an arbitrary figure, or it may be solely dependent upon the next external event 250, depending upon the particular application. In FIG. 2, the skip-ahead time 240 is illustrated as being prior to the next scheduled external event 250, for generality.

In the network simulation example, at time 230 the steady state is detected. Parameters corresponding to this steady state (for example, the steady state probability distribution of number of packets in a queue) are used for estimating the state of the system at time 240, which will generally correspond to the next external or explicit event 250. The steady-state distribution characterization may be related to the arrival and departure process of packets within a queue, or it may be a snapshot of the queue size at any random time within a certain past simulation time (e.g., between 210 and 230).

Also illustrated in FIG. 2 are internal events 235 that may have been scheduled to occur after the time 230. If the state of the system is dependent upon these scheduled events, these events 235 are rescheduled as events 235', relative to the skip-ahead time 240.

Figure 3:
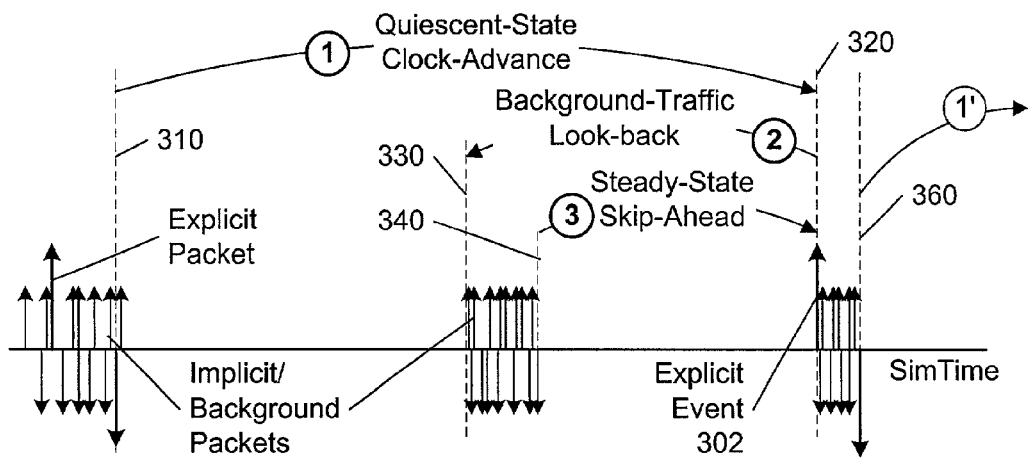
FIG. 3 illustrates an example timing diagram of a mixed-mode network simulation in accordance with this invention.

FIG. 3 illustrates an example timing diagram of the skip-ahead process of this invention, in the context of the mixed-mode simulator of the referenced co-pending patent application. The example mixed-mode simulator simulates the arrival and departure of packets through a network.

In FIG. 3, packet arrivals are indicated by up-arrows, and packet departures are indicated by down-arrows. Explicit-events, indicated by the taller arrows, are used to trace the performance of the system as explicit-packets traverse the network. To provide for a realistic simulated performance, the explicit-packets are simulated in the context of traveling amid typical background traffic. The user of the simulator specifies the parameters of sets of background traffic, such as the average packet size, average packet arrival rate, and so on, as well as variances associated with these averages.

Because the simulated performance of the system is analyzed in the context of the explicit-events, the mixed-mode simulator of the copending application is configured to only simulate a network component (node) when an explicit-event is being processed by the node. In the network simulator of the copending application, explicit and implicit traffic arrive at a node generally in the form of packets. The simulation of the node includes placing the arriving packets (up arrows) into one or more queues, and subsequently removing packets (down arrows) from these queues upon service completion before they are routed to other nodes. In accordance with the principles taught in the referenced copending application, when the explicit-packet is removed from the node, at 310, this node need no longer be simulated, and the simulation time for this node is advanced to the next scheduled explicit-event at this node.

As is known in the art, the propagation of a packet through a node is dependent upon a variety of conditions, including how many other packets the node is processing when the packet arrives. In order to realistically simulate the arrival 320 of an explicit-traffic packet at a node, the node must be placed in a realistic state, to accurately reflect the processing of the explicit-traffic packet when it arrives. The mixed-mode simulator of the copending application is configured to determine the state of the node by looking-back a certain period, to 330, and to thereafter simulate the effects of background traffic on the node, from that point on, before the explicit-traffic packet arrives, at 320. This look-back time 330 is selected to be sufficiently prior to the explicit-event time 320 so that the condition of the node at the time of arrival of the explicit-traffic packet realistically portrays the effects of the background traffic. However, the processing of background traffic as implicit packet events is a time-consuming process, and the duration of the look-back period can have a substantial impact on the time required to perform the simulation. In a preferred embodiment, the look-back time is defined as 310, which is the previous explicit external event.

In accordance with this invention, when the simulation of the background traffic produces a steady-state condition, at 340, the simulator is configured to skip-ahead to the time of arrival of the explicit-traffic packet, at 320. The steady-state information is used for estimating the state of the node, typically a set of queue lengths corresponding to the defined queues within the node, at time 320. Thereafter, the processing of the arrival of the explicit-event at 320 with these queue parameters is simulated, along with the continuing processing of background traffic (i.e. arrival of subsequent implicit-packets). When the explicit-event is removed from the node, at 360, the simulation time is again advanced to the next explicit-event, as discussed above.

Figure 4:
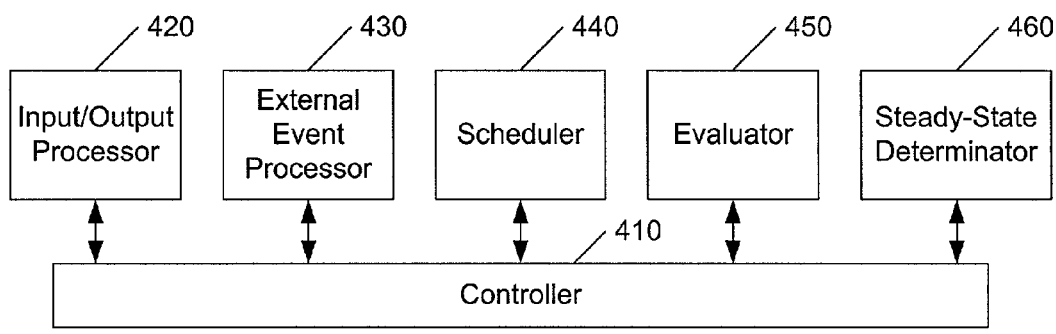
FIG. 4 illustrates an example block diagram of a simulator in accordance with this invention.

FIG. 4 illustrates an example block diagram of a simulator in accordance with this invention. The simulator 400 includes a controller 410 that controls the interaction among each of the subsystems 420–460, and other optional subsystems. An input/output processor 420 provides the user interface to the system. An external event processor 430 provides the processing of user specified input stimuli or conditions to the simulated system, and provides scheduled events to a scheduler 440. The scheduler 440 provides the required scheduling and control of both external events, such as those caused by the specified input stimuli, and internal events, such as those produced in response to the external events. An evaluator 450 evaluates the elements comprising the simulated system, as the scheduled events arrive, and produces new events for scheduling, based on these input scheduled events.

In accordance with this invention, the simulator 400 includes a steady-state determinator 460 that is configured to determine whether the simulated system is in a steady-state condition, and, if so, to skip-ahead to the next scheduled external event, as detailed above.

As noted above, any of a variety of techniques may be applied to determine whether a system is in a steady-state condition. In the oscillation example above, a Fourier analysis may determine a continuous oscillation. In the networking example above, statistical-analysis techniques may be employed to determine whether a system or node is in a steady-state condition. Predictive techniques may also be used to determine a future steady-state condition. In the field of circuit simulation, for example, a voltage from a device may be evaluated to determine whether it is asymptotically approaching a steady-state value, and the simulation can skip-ahead to the next external event, at which time the predicted value of the voltage is used.

In a preferred embodiment of this invention for network simulation, the steady-state condition is determined based on a convergence of time averages associated with the queue sizes for queues through which traffic flows. If the packet arrival rate to a queue is less than that queue's packet service rate, then, an incoming explicit or implicit packet may not encounter any simulation wait-time before getting processed. Since these packets will not be contending with other packets existing in the queuing sub-system, these will get processed quickly (i.e., without any internal packet arrival-departure modeling). However, for high packet arrival rate (for implicit and/or explicit packets), the time it takes to reach a steady state, or convergence, increases, as there are many packets contending for a common resource.

To determine queue size convergence, a variety of analysis techniques may be applied. In a straightforward embodiment, for example, a running average of each of the queue lengths may be computed, and when each of the averages are contained within a pre-specified threshold value, a steady-state condition is declared. A weighted average may also be used to give more or less significance to prior events. Alternatively, the number of packets processed per fixed unit of time may be computed, and the stability of this number can be used to determine convergence to a steady-state condition. Other analysis tests, including conventional statistical tests, may also be employed to determine whether a system or component within a system is in a steady state condition.

In a preferred embodiment, the queue size convergence to a steady-state is based on three succeeding time periods whose lengths increase geometrically (the second period being twice as long as the first one and the third period being twice as long as the second one). The first (shortest) time period should be at least an order of magnitude larger than the average interarrival time of implicit packets produced by the background traffic at a node. If the averages of the queue length statistic samples obtained for these three time periods differ by less than a threshold value, the system is defined as being in a steady state condition. Optionally, the second moment information (variance) of queue-lengths within each time period can also be used as a criterion for declaring a steady state condition As would be evident to one of ordinary skill in the art, conventional statistical techniques, such as Analysis of Variance (ANOVA) techniques, may also be used to determine a steady-state condition in view of this disclosure.

The foregoing merely illustrates the principles of the invention. It will thus be appreciated that those skilled in the art will be able to devise various arrangements that, although not explicitly described or shown herein, embody the principles of the invention. For example, the invention is presented using examples wherein the simulated system achieves a steady-state condition. As would be evident to one of ordinary skill in the art in view of this disclosure, the steady-state skip-ahead can be applied to sub-systems, or components, within the simulated system as well. In the example of mixed-mode simulator, network nodes can be evaluated independently for achieving a steady-state condition, and the scheduled events at each node can be suitably adjusted based on this evaluation. These and other system optimizations will be apparent to one of ordinary skill in the art, and are thus within the spirit and scope of the following claims.

We claim:

1. A method of simulation of a modeled system, comprising:
    evaluating the modeled system in response to stimuli at a first time, to produce a subsequent state of the modeled system corresponding to a second time,
    determining whether the modeled system is in a non-quiescent steady-state condition at the second time, and
    if the modeled system is not in the non-quiescent steady-state condition:
        evaluating the modeled system from the second time and beyond, based on the subsequent state; and
    if the modeled system is in the non-quiescent steady-state condition:
        defining an initial state of the modeled system at a skip-ahead time that differs from the second time, based on the non-quiescent steady-state condition, and
        evaluating the modeled system from the skip-ahead time and beyond, based on the initial state,
    wherein the non-quiescent steady-state condition includes:
        at least one substantial change within the modeled system between the first time and the second time, and
        a prediction state from which the initial state is determined.

2. The method of claim 1, wherein
the skip-ahead time is dependent upon a next scheduled external event that is to be applied to the modeled system.

3. The method of claim 1, further including
predicting the initial state, based on the non-quiescent steady-state condition.

4. The method of claim 1, wherein
the initial state corresponds to a time-shift of the subsequent state.

5. The method of claim 1, wherein
determining whether the modeled system is in the non-quiescent steady-state condition includes
    collecting one or more statistics related to prior states of the modeled system, and
    comparing the one or more statistics to one or more threshold values.

6. The method of claim 5, wherein
the modeled system includes a node having a queuing element, and
the one or more statistics includes at least one of:
    an average of queue measures of the queuing element, corresponding to prior states of the node, and
    a variance of the queue measures of the queuing element.

7. The method of claim 6, wherein
the queue measures include at least one of a queue length and a queuing delay.

8. The method of claim 6, wherein
the node further includes a plurality of other queuing elements, and
the one or more statistics further include statistics based on queue measures associated with each of the other queuing elements.

9. The method of claim 1, wherein
the modeled system comprises a plurality of elements that receive background-traffic and explicit-traffic, and
the stimuli include implicit events that are provided based on parameters of the background-traffic.

10. The method of claim 9, wherein
the first time corresponds to a look-back period relative to a time of an explicit event of the explicit-traffic.

11. The method of claim 10, wherein
the skip-ahead time corresponds to the time of the explicit event.

12. The method of claim 1, wherein
determining whether the modeled system is in the non-quiescent steady-state condition includes
    determining whether a parameter associated with the subsequent state is converging to a predictable value.

13. A simulator comprising:
an external event processor that is configured to provide input stimuli to a modeled system,
an evaluator that is configured to evaluate elements of the modeled system based on scheduled input events, and to produce therefrom changes of state of one or more elements, and output events, a scheduler that is configured to receive scheduled external events corresponding to the input stimuli, and the output events from the evaluator, and to provide therefrom the scheduled input events to the evaluator, a controller that is configured to manage and provide a simulation time measure to the scheduler, for determining the appropriate scheduled input events that are provided to the evaluator, and a steady-state determinator that is configured to determine whether one or more elements of the modeled system are in a non-quiescent steady-state condition, wherein:

the non-quiescent steady-state condition of the one or more elements includes:
- at least one substantial change at the one or more elements, and
- a prediction state from which future state information can be determined, and if the one or more elements are in the non-quiescent steady-state condition:
- the scheduler is further configured to provide the future state information corresponding to the state of the one or more elements at a skip-ahead time, and
- the evaluator is further configured to evaluate the one or more elements, based on the state information corresponding to the state of the one or more elements at the skip-ahead time.

14. The simulator of claim 13, wherein
the scheduler is further configured to adjust one or more of the scheduled input events relative to the skip-ahead time, based on whether the one or more elements are in the non-quiescent steady-state condition.

15. The simulator of claim 14, further including
an input/output processor that is configured to receive user input related to the input stimuli and the modeled system, and to provide an output related to one or more of the output events.

16. The simulator of claim 13, wherein
the skip-ahead time is based on a time of an event of the scheduled external events.

17. The simulator of claim 13, wherein
the steady-state determinator determines whether the modeled system is in the non-quiescent steady-state condition based on one or more statistics related to prior states produced by the evaluator.

18. The simulator of claim 17, wherein
the modeled system comprises a plurality of elements, and
the one or more statistics includes at least one of:
- an average of a measure related to prior states of an element of the plurality of elements, and
- a variance of the measure.

19. The simulator of claim 17, wherein
at least one of the plurality of elements includes a queuing element, and
the measure includes at least one of a queue length and a queue time.

20. The simulator of claim 19, wherein
the at least one of the plurality of elements further includes a plurality of other queuing elements, and
the one or more statistics further include statistics based on queue measures associated with each of the other queuing elements.

21. The simulator of claim 13, wherein
the modeled system comprises a plurality of elements that receive background-traffic and explicit-traffic, and the external event processor is further configured to provide scheduled implicit events to the scheduler, based on parameters of the background-traffic.

22. The simulator of claim 21, wherein
the external event processor provides the scheduled implicit events based on a look-back period relative to a time of an explicit event of the explicit-traffic.

23. The simulator of claim 22, wherein
the skip-ahead time corresponds to the time of the explicit event.

24. The simulator of claim 13, wherein
the steady-state determinator is configured to determine whether one or more elements of the modeled system are in the non-quiescent steady-state condition based upon whether a parameter associated with the changes of state are converging to a predictable value.

25. A computer program on a media suitable for operating on a computer system, which, when executed by the computer system, causes the computer system to:
- evaluate a modeled system in response to stimuli at a first time, to produce a subsequent state of the modeled system corresponding to a second time,
- determine whether the modeled system is in a non-quiescent steady-state condition at the second time, and
- if the modeled system is not in the non-quiescent steady-state condition:
  - evaluate the modeled system from the second time and beyond, based on the subsequent state; and
- if the modeled system is in the non-quiescent steady-state condition:
  - define an initial state of the modeled system at a skip-ahead time that differs from the second time, based on the non-quiescent steady-state condition, and
  - evaluate the modeled system from the skip-ahead time and beyond, based on the initial state,
- wherein the non-quiescent steady-state condition includes:
  - at least one substantial change within the modeled system, and
  - a prediction state from which the initial state is determined.

26. The computer program of claim 25, wherein the program is configured to cause the computer system to determine whether the modeled system is in the non-quiescent steady-state condition based on
a comparison of one or more statistics related to prior states of the modeled system to one or more threshold values.

27. The computer program of claim 26, wherein
the modeled system includes a node having a queuing element, and
the one or more statistics includes at least one of:
- an average of queue measures of the queuing element, corresponding to prior states of the node, and
- a variance of the queue measures of the queuing element.

28. The computer program of claim 27, wherein
the queue measures include at least one of a queue length and a queue time.

29. The computer program of claim 28, wherein
the node further includes a plurality of other queuing elements, and
the one or more statistics further include statistics based on queue measures associated with each of the other queuing elements.

30. The computer program of claim 25, wherein the modeled system comprises a plurality of elements that receive background-traffic and explicit-traffic, and the stimuli include implicit events that are provided based on parameters of the background-traffic.

31. The computer program of claim 30, wherein the first time corresponds to a look-back period relative to a time of an explicit event of the explicit-traffic.

32. The computer program of claim 31, wherein the skip-ahead time corresponds to the time of the explicit event.

33. A module for use in a computer program, which, when executed on a computer system, causes the computer system to determine whether a simulated element in a modeled system is in a non-quiescent steady-state condition, to facilitate:

a determination of an initial state of the simulated element at a skip-ahead time, and a subsequent simulation of the simulated element at the skip-ahead time, based on the initial state of the simulated element at the skip-ahead time, wherein the non -quiescent steady-state condition includes:

at least one substantial change at the simulated element, and a prediction state from which the initial state of the simulated element is determined.

34. The module of claim 33, wherein the module is configured to cause the computer system to determine whether the simulated element is in the non-quiescent steady-state condition based on a comparison of one or more statistics related to prior states of the simulated element to one or more threshold values.

35. The module of claim 34, wherein the simulated element includes a queuing element, and the one or more statistics includes at least one of:

an average of queue measures of the queuing element, corresponding to prior states of the simulated element, and a variance of the queue measures of the queuing element.

36. The module of claim 35, wherein the queue measures include at least one of a queue length and a queue time.

37. The module of claim 36, wherein the simulated element further includes a plurality of other queuing elements, and the one or more statistics further include statistics based on queue measures associated with each of the other queuing elements.

* * * * *